United States Patent
Ho et al.

(10) Patent No.: US 7,893,726 B1
(45) Date of Patent: Feb. 22, 2011

(54) LEAKAGE COMPENSATION AND IMPROVED SETUP/HOLD TIME IN A DYNAMIC FLIP-FLOP

(75) Inventors: Vinh Van Ho, San Jose, CA (US); Tim Tri Hoang, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/782,443

(22) Filed: Jul. 24, 2007

(51) Int. Cl.
*G01R 19/00* (2006.01)
(52) U.S. Cl. .......................... 327/57; 327/52; 330/252; 330/277
(58) Field of Classification Search .............. 327/51, 327/52, 57
See application file for complete search history.

(56) References Cited
U.S. PATENT DOCUMENTS
6,232,810 B1 * 5/2001 Oklobdzija et al. ......... 327/217

2002/0135401 A1 * 9/2002 Watarai ..................... 327/55
2002/0171453 A1 * 11/2002 Kanamori et al. .......... 327/57
2005/0162193 A1 * 7/2005 Payne et al. ............... 327/52

* cited by examiner

*Primary Examiner*—Lincoln Donovan
*Assistant Examiner*—Ryan C Jager
(74) *Attorney, Agent, or Firm*—Ropes & Gray LLP

(57) ABSTRACT

A dynamic flip-flop includes first and second input stages forming a differential input stage adapted to receive differential data. The flip-flop is reset in response to a reset signal. To ensure proper operation, a transistor disposed between the first and second input stages is always maintained active to provide a conduction path between the ground terminal and the nodes that may be charged from the supply voltage. To improve the setup and hold time of the flip-flop, the clock signal is applied to a first transistor disposed in the first input stage and a second transistor disposed in the second input stage.

4 Claims, 3 Drawing Sheets

US 7,893,726 B1

LEAKAGE COMPENSATION AND IMPROVED SETUP/HOLD TIME IN A DYNAMIC FLIP-FLOP

BACKGROUND OF THE INVENTION

The present invention relates to electronic circuits, and more particularly to a dynamic flip-flop.

Flip-flops are widely used in electronic circuits to store and supply data. One type of flip-flop, commonly known as a dynamic flip-flop (DFF), operates differentially at relatively high speeds and consumes relatively low power. A DFF adapted to operate at a high speed, may have an excessive leakage current when operated at a relatively lower speed. The leakage may result in operational failure of the DFF.

FIG. 1 is a block diagram of a DFF 10, as known in the prior art. DFF 10 is shown as including a differential sense amplifier 100 and an SR latch 50. FIG. 2 is transistor schematic diagram of differential sense amplifier 100 of FIG. 1. Differential sense amplifier 100 includes a latch 150 adapted to store data. Accordingly, differential sense amplifier 100 is alternatively referred to hereinbelow as a latch.

Differential sense amplifier 100 is adapted to be reset when signal RSTN is at a low level and is adapted to store data when signal RSTN is at a high level and in response to the clock signal CLK. Assume signal RSTN is at a high level and signal CLK is at a low level. Accordingly, nodes RB and SB are charged to the supply voltage Vcc respectively via transistors 110, and 210. The high voltage at node SB causes node SB1 to be charged to voltage (Vcc-$V_{th}$), where $V_{th}$ is the threshold voltage of any of the NMOS transistors shown in FIG. 2. Similarly, the high voltage at node RB causes node RB1 to be charged to voltage (Vcc-$V_{th}$).

Assume that the data supplied to terminal D is at a high level, i.e., logic level 1, when clock signal CLK transitions from low to high. This transition causes node SB1 to be pulled to the Vss potential via transistors 116, 128 and 130. Because the data supplied to terminal DB is the inverse of that supplied to terminal D, node RB1 remains at its previous high voltage. The low voltage at node SB1 also enables the voltage at node SB to be pulled to the Vss potential via transistor 114. Accordingly, when the clock signal switches from low to high, if terminals D and DB are at high and low voltage levels respectively, node SB is discharged to the Vss potential. Transistors 112, 114, 212 and 214 form a latch 150 adapted to maintain nodes SB and RB at their respective low and high values.

Inversely, when the clock signal switches from low to high, if terminals D and DB are at low and high voltage levels respectively, node RB is discharged to the Vss potential, whereas node SB is maintained at the Vcc potential. Latch 150 maintains nodes SB and RB at their respective high and low values.

Assume latch 150 is set such that nodes SB and RB are respectively at low and high values. Assume after latch 150 is set and while clock signal CLK is active high, data input terminal D switches to a low level. Accordingly, transistor 116 is turned off thus causing node SB1 and SB to float. When differential sense amplifier 100 operates at a low clock frequency, node SB may be charged to the Vcc potential via transistors 102, 110 and 112, causing DFF 100 to switch state, thereby resulting in operational failure of sense amplifier 100.

SUMMARY OF THE INVENTION

A dynamic flip-flop in accordance with one embodiment of the present invention includes first and second input stages forming a differential input stage adapted to receive differential data. The flip-flop is reset in response to a reset signal. To ensure proper operation, a transistor disposed between the first and second input stages is always maintained active to provide a conduction path between the ground terminal and the nodes that may be charged from the supply voltage. To improve the setup and hold time of the flip-flop, the clock signal is applied to a first transistor disposed in the first input stage and a second transistor disposed in the second input stage.

DETAILED DESCRIPTION OF THE INVENTION

Figure 4:
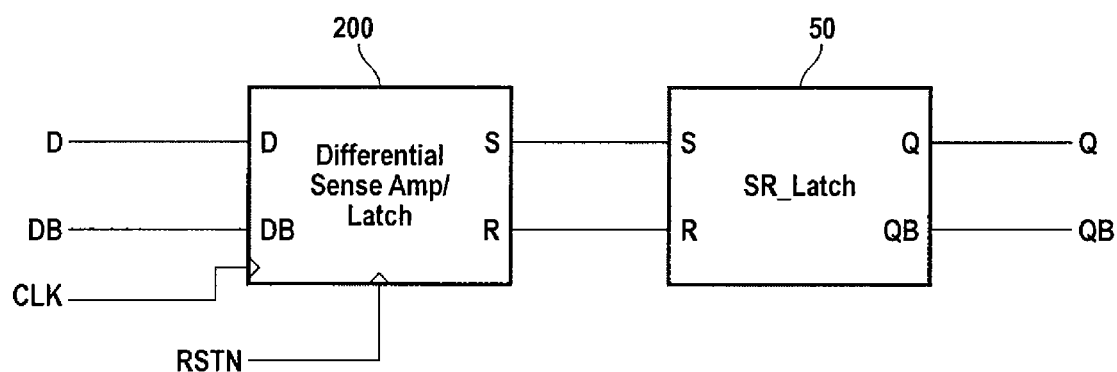
FIG. 4 is a block diagram of a dynamic flip-flop embodying the sense amplifier/latch of the present invention.
Figure 3:
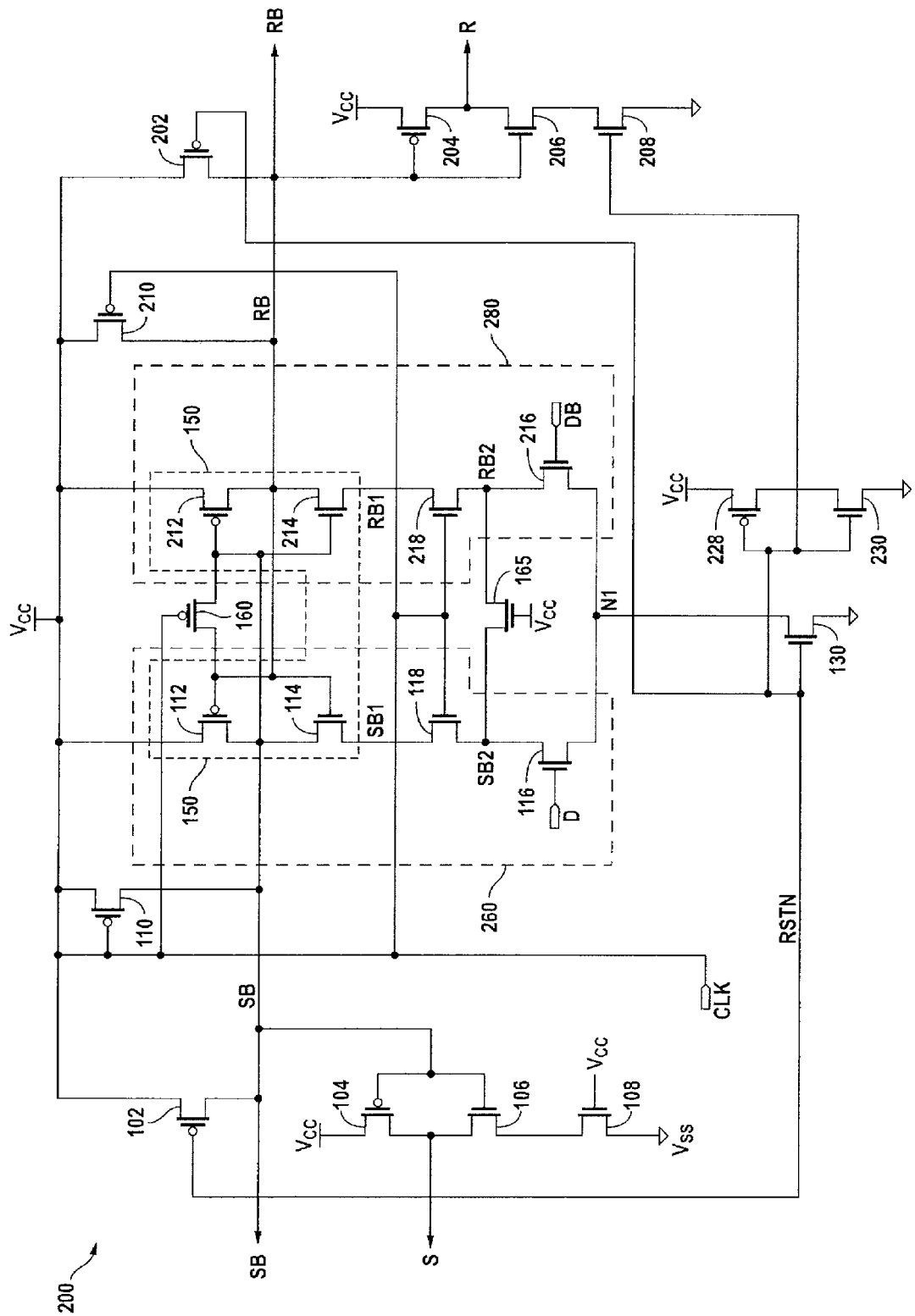
FIG. 3 is a transistor schematic diagram of a sense amplifier/latch of a dynamic flip-flop, in accordance with embodiment of the present invention.

FIG. 3 is a transistor schematic diagram of a sense amplifier/latch 200, in accordance with one embodiment of the present invention. Sense amplifier/latch 200 may be used to together with an SR latch 50 to form a dynamic flip-flop, as shown in FIG. 4.

Referring to FIG. 3, differential sense amplifier 200 includes a latch 150 adapted to store data. Accordingly, differential sense amplifier 200 is alternatively referred to herein below as a latch. Differential sense amplifier 200 is adapted to be reset when signal RSTN is at a low level and to store data when signal RSTN is at a high level. Sense amplifier 200 stores the data applied to terminal D in latch 150 when clock signal CLK makes a low to high transition.

Sense amplifier 200 is shown as including a pair of input stages 260 and 280. Input stages 260 and 280 form a differential input stage receiving differential input data D and DB. Input stage 260 is shown as including transistors 112, 114, 118 and 116. Input stage 280 is shown as including transistors 212, 214, 218 and 216. Input stages 260 and 280 share a common node N1 that is coupled to a drain terminal of transistor 130. The source terminal of transistor 130 is coupled to the Vss terminal, which may be a ground terminal. The gate terminal of transistor 130 receives the reset signal RSTN. Transistors 112 and 114 form an inverter pair disposed in input stage 260. Similarly, transistors 212 and 214 form an inverter pair disposed in input stage 280. The two inverter pairs form latch 150. Transistor 160 is disposed between the two inverter pairs.

Figure 1:
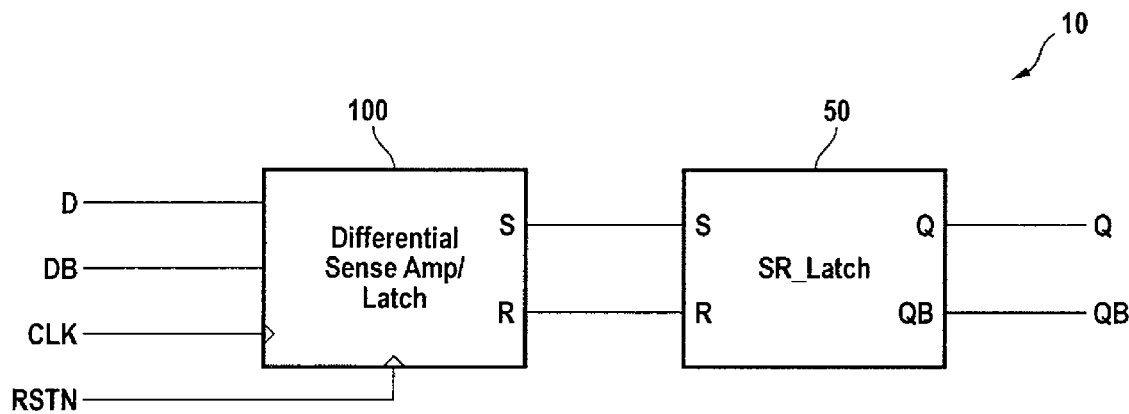
FIG. 1 is a block diagram of a dynamic flip-flop, as known in the prior art.

Assume signal RSTN is at a high level and the clock signal CLK is at a low level. Accordingly, nodes SB and RB are charged to the supply voltage Vcc respectively via transistors 110, and 210. The high voltage at node SB causes node SB1 to be charged to voltage (Vcc-$V_{th}$), where $V_{th}$ is the threshold voltage of any of the NMOS transistors shown in FIG. 1. Similarly, the high voltage at node NB causes node NB1 to be charged to voltage (Vcc-$V_{th}$).

To store a logical 1 in latch 150, node D is raised to a high voltage level and node DB is lowered to a low voltage level when clock signal CLK makes a low-to-high transition. This transition causes node SB1 to be pulled to the Vss potential via transistors 116, 118 and 130. Because the voltage at node DB is the inverse of the voltage at node D, node RB1 remains at its previous high voltage. The low voltage at node SB1 causes the voltage at node SB to be pulled to the Vss potential via transistor 114. The low voltage at node SB causes node RB to be maintained at or raised to the Vcc potential. This causes latch 150 to be set so that even after the clock signal is removed, the data stored in the latch remains unchanged. An inverse of these operations occurs when node D receives a low voltage and node DB receives a high voltage.

Transistor 165 has a gate terminal receiving the supply voltage Vcc and drain and source terminals disposed between nodes SB2 and RB2. Transistor 165 is selected to have a relatively small channel width (W) to channel length (L) ratio so as to be able to conduct a relatively small amount of current at all times. Assume latch 150 is set such that nodes SB and RB are respectively at low and high values. Assume further that while clock signal CLK is active high, data input terminal D switches to a low level. If data input terminal D switches to a low voltage level while clock signal CLK is active high, transistor 116 is turned off. The turning off of transistor 116 terminates the conduction path between node SB and the Vss potential via transistors 114, 118, 116 and 130.

In accordance with the present invention, even when transistor 116 is turned off, because transistor 165 is always on, a path from node SB to ground is formed via transistors 114, 118, 165, 216 and 130, since terminal DB receives the inverse of the signal applied to terminal D. Therefore, even when differential sense amplifier 100 operates at a low clock frequency, any charges supplied to node SB via transistors 102, 110 and 112 from the Vcc supply voltage, are discharged to the Vss terminal via transistors 114, 118, 165, 216 and 130 to ensure proper operation.

Similarly, assume latch 150 is set such that nodes RB and SB are respectively at low and high values. Assume further that while clock signal CLK is active high, data input terminal DB switches to a low level. If data input terminal DB switches to a low level while clock signal CLK is active high, transistor 216 is turned off. The turning off of transistor 216 terminates the conduction path between node RB and the Vss terminal via transistors 214, 218, 216 and 130.

In accordance with the present invention, even when transistor 216 is turned off, because transistor 165 is always on, a path from node RB to ground is formed via transistors 214, 218, 165 and 116 and 130, since terminal D receives the inverse of the signal applied to terminal DB. Therefore, even when differential sense amplifier 100 operates at a low clock frequency, any charges supplied to node RB via transistors 212 and 210 from the VCC, are discharged to the Vss potential via transistors 214, 218, 165 and 116 and 130 to ensure proper operation of sense amplifier 100.

Transistor 118 disposed between transistors 114 and 116 of input stage 260 receives the clock signal CLK at its gate terminal. Similarly, transistor 218 disposed between transistors 214 and 216 of input stage 260 receives the clock signal CLK at its gate terminal. Because transistors 118 and 218 are disposed differentially, sense amplifier 200 has an improved setup and hold time, as described further below.

Figure 2:
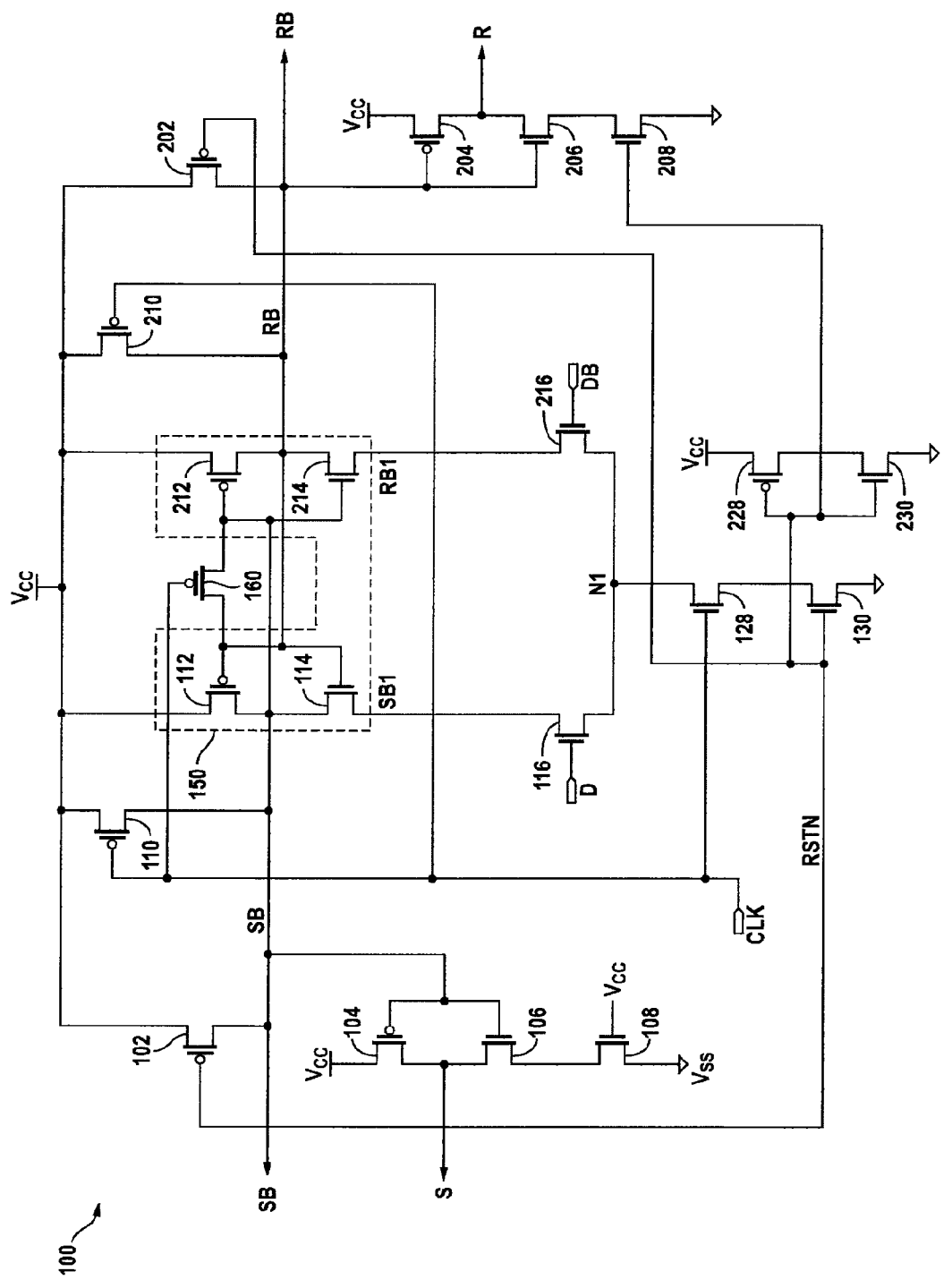
FIG. 2 is a transistor schematic diagram of the sense amplifier/latch disposed in the dynamic flip-flop of FIG. 1, as known in the prior art.

When a logic 1 is stored in latch 150, node SB is charged to supply voltage Vcc, and node SB1 is charged to the voltage Vcc-$V_{th}$. When clock signal CLK is at a high level, node N1 of sense amplifier 200 is at zero volts. Accordingly the total charge to be removed from these three nodes is equivalent to (2Vcc-$V_{th}$). In sense amplifier 100 FIG. 2, when a logic 1 is stored in latch 150, and node SB is charged to supply voltage Vcc, node SB1 is charged to the voltage Vcc-$V_{th}$. In sense amplifier 100 FIG. 2, when clock signal CLK is at a high level, node N1 of sense amplifier 200 is at Vcc-$V_{th}$ volts. Accordingly the total charge to be removed from these three nodes is equivalent to (3Vcc-2$V_{tm}$). Accordingly, because nodes SB and RB are of sense amplifier 200 are discharged faster than nodes SB and RB of sense amplifier 100, sense amplifier 200 has a shorter setup and hold times than sense amplifier 100.

The above embodiments of the present invention are illustrative and not limiting. Various alternatives and equivalents are possible. The invention is not limited by the type of integrated circuit in which the present disclosure may be disposed. Nor is the invention limited to any specific type of process technology, e.g., CMOS, Bipolar, or BICMOS that may be used to manufacture the present disclosure. Other additions, subtractions or modifications are obvious in view of the present disclosure and are intended to fall within the scope of the appended claims.

What is claimed is:

1. A circuit comprising:
   a first transistor responsive to a data signal, said first transistor having a first current carrying terminal coupled to a first node;
   a second transistor responsive to an inverse of the data signal, said second transistor having a first current carrying terminal coupled to the first node;
   a third transistor coupled to the first transistor and a fifth transistor and having a gate terminal responsive to a clock signal;
   a fourth transistor coupled to the second transistor and a seventh transistor and having a gate terminal responsive to the clock signal;
   sixth, and eight transistors, wherein a gate terminal of each of the fifth and sixth transistors is responsive to an output signal of the seventh and eight transistors, and wherein a gate terminal of each of the seventh and eight transistors is responsive to an output signal of the fifth and sixth transistors, wherein said third transistor has a first current-carrying terminal coupled to a first current-carrying terminal of the fifth transistor and a second current-carrying terminal coupled to a second current carrying terminal of the first transistor, and wherein said fourth transistor has a first current-carrying terminal coupled to a first current-carrying terminal of the seventh transistor and a second current-carrying terminal coupled to a second current carrying terminal of the second transistor;
   a ninth transistor having a gate terminal responsive to the clock signal, a first current carrying terminal coupled to the gate terminals of the fifth and sixth transistors, and a second current carrying terminal coupled to the gate terminals of the seventh and eight transistors; and
   a tenth transistor having a gate terminal coupled to a first supply voltage, a first current carrying terminal coupled to the second current carrying terminal of the first transistor, and a second current carrying terminal coupled to the second current carrying terminal of the second transistor, said tenth transistor being adapted to conduct current at all times; wherein said first node is not discharged in response to the clock signal.

2. The circuit of claim 1 further comprising:
   an eleventh transistor adapted to discharge the first node in response to a reset signal.

3. The circuit of claim 2 further comprising:
   a twelfth transistor adapted to charge the gate terminals of the seventh and eight transistors to the second supply voltage in response to the reset signal; and
   a thirteenth transistor adapted to charge the gate terminals of the fifth and sixth transistors to the second supply voltage in response to the reset signal.

4. The circuit of claim 3 further comprising:
a fourteenth transistor adapted to charge the gate terminals of the seventh and eight transistors to the second supply voltage in response to the clock signal; and
a fifteenth transistor adapted to charge the gate terminals of the fifth and sixth transistors to the second supply voltage in response to the clock signal.

* * * * *